United States Patent
Pal et al.

(10) Patent No.: US 9,678,556 B2
(45) Date of Patent: Jun. 13, 2017

(54) DYNAMIC CLOCK AND VOLTAGE SCALING WITH LOW-LATENCY SWITCHING

(71) Applicant: QUALCOMM Incorporated, San Diego, CA (US)

(72) Inventors: Dipti Ranjan Pal, San Diego, CA (US); Paul Ivan Penzes, Irvine, CA (US); Mohamed Waleed Allam, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 305 days.

(21) Appl. No.: 14/177,073

(22) Filed: Feb. 10, 2014

(65) Prior Publication Data

US 2015/0227185 A1    Aug. 13, 2015

(51) Int. Cl.
G06F 1/08    (2006.01)
G06F 1/32    (2006.01)
H03L 7/22    (2006.01)

(52) U.S. Cl.
CPC .......... *G06F 1/3203* (2013.01); *G06F 1/324* (2013.01); *G06F 1/3234* (2013.01); *G06F 1/3243* (2013.01); *H03L 7/22* (2013.01); *G06F 1/08* (2013.01); *G06F 1/3296* (2013.01); *Y02B 60/1217* (2013.01); *Y02B 60/1239* (2013.01)

(58) Field of Classification Search
CPC .......... G06F 1/08; G06F 1/324; G06F 1/3275
See application file for complete search history.

(56) References Cited

U.S. PATENT DOCUMENTS

| 6,215,725 B1 | 4/2001 | Komatsu |
| 7,865,749 B2 | 1/2011 | Sandon et al. |
| 8,135,966 B2 | 3/2012 | Rozen et al. |

(Continued)

FOREIGN PATENT DOCUMENTS

| EP | 1793498 A2 | 6/2007 |
| WO | 0067102 A1 | 11/2000 |

OTHER PUBLICATIONS

International Search Report and Written Opinion—PCT/US2015/014688—ISA/EPO—Apr. 23, 2015.

(Continued)

*Primary Examiner* — Mohammed Rehman
*Assistant Examiner* — Alyaa T Mazyad
(74) *Attorney, Agent, or Firm* — Loza & Loza, LLP/Qualcomm

(57) ABSTRACT

Systems and methods for dynamic clock and voltage scaling can switch integrated circuits between frequency-voltage modes with low latency. These systems include a resource power manager that can control a power management integrated circuit (PMIC), phase locked loops (PLLs), and clock dividers. The resource power manager controls transitions between frequency-voltage modes. The systems and methods provide dynamic clock and voltage scaling where the transitions between frequency-voltage modes are an atomic operation. Additionally, the resource power manager can control many modules, for example, clock dividers, in parallel. The invention can, due to lower latency between frequency-voltage modes, can provide improved system performance and reduced system power.

24 Claims, 6 Drawing Sheets

(56) References Cited

U.S. PATENT DOCUMENTS

| | | | |
|---|---|---|---|
| 8,190,931 B2 | 5/2012 | Laurenti et al. | |
| 8,448,001 B1 | 5/2013 | Zhu et al. | |
| 2002/0087896 A1 | 7/2002 | Cline et al. | |
| 2004/0193934 A1* | 9/2004 | Kahn | G06F 1/3203 |
| | | | 713/500 |
| 2005/0076258 A1* | 4/2005 | Cheung | G06F 1/08 |
| | | | 713/322 |
| 2007/0069778 A1* | 3/2007 | Choi | G06F 7/68 |
| | | | 327/158 |
| 2008/0307240 A1 | 12/2008 | Dahan et al. | |
| 2010/0077232 A1 | 3/2010 | Jahagirdar et al. | |
| 2013/0293271 A1* | 11/2013 | Song | G06F 1/08 |
| | | | 327/115 |

OTHER PUBLICATIONS

"Changing clocks on the ARM1136JF-S Core Module," Mar. 2007 (Mar. 2007), XP055239265, Retrieved from the Internet: URL:http://infocenter.arm.com/help/topic/com.arm.doc.dai0174a/ AN174_changing_CM1136_clocks.pdf [retrieved on Jan. 7, 2016].

* cited by examiner

DYNAMIC CLOCK AND VOLTAGE SCALING WITH LOW-LATENCY SWITCHING

BACKGROUND

Field

The present invention relates to integrated circuits and electronic processing systems and, more particularly, to dynamic control of clock and voltage scaling in integrated circuits and electronic processing systems.

Background

Integrated circuits have grown increasingly complex. To improve trade-offs between performance and power, an integrated circuit may operate at different frequencies and different voltages at different times. For example, an integrated circuit may operate in various frequency-voltage modes that include a high-performance mode and a low-power mode. The high-performance mode uses a high clock frequency and high supply voltage and thus provides high performance but also has high power consumption. The low-power mode uses a low clock frequency and low supply voltage and thus provides low power consumption but also has low performance. Additionally, various blocks inside an integrated circuit may operate at different frequencies and at different voltages.

SUMMARY

Systems and methods for dynamic clock and voltage scaling that can switch integrated circuits between frequency-voltage modes with low latency are provided. These systems include a resource power manager module that can control a power management integrated circuit (PMIC), phase locked loops (PLLs), and clock dividers. The resource power manager controls transitions between frequency-voltage modes. The systems and methods provide dynamic clock and voltage scaling where the transitions between frequency-voltage modes are an atomic operation. Additionally, the resource power manager module can control many modules, for example, clock dividers, in parallel. The invention can, due to lower latency between frequency-voltage modes, provide improved system performance and reduced system power.

In one aspect, an integrated circuit is provided that includes: a processor module configured to execute software instructions; a plurality of clock divider modules, each of the clock divider modules configured to produce an output clock signal based on control inputs; and a resource power manager module configured to receive a mode selection from the processor module, the mode selection indicating one of a plurality of operating modes, the resource power manager module further configured to concurrently supply the control inputs to control at least two of the plurality of clock divider modules to operate according to the selected one of the plurality of operating modes.

In one aspect, a method for switching operating modes in an integrated circuit is provided that includes: selecting one of a plurality of frequency-voltage modes as a new operating mode for the integrated circuit, each of the frequency-voltage modes specifying clock module controls and voltages for the integrated circuit; signaling the voltages specified by the selected frequency-voltage mode to a power management integrated circuit; and signaling the clock module controls specified by the selected frequency-voltage mode to a plurality of clock divider modules, each of the clock divider modules configured to produce an output clock signal based on control inputs, wherein the clock module controls specified by the selected frequency-voltage mode are supplied to at least two of the plurality of clock divider modules concurrently.

In one aspect, an integrated circuit is provided that includes: a processor module configured to execute software instructions; a plurality of clock divider modules, each of the clock divider modules configured to produce an output clock signal based on control inputs; and a means for managing resource power configured to receive a mode selection from the processor module, the mode selection indicating one of a plurality of operating modes, and configured to concurrently control at least two of the plurality of clock divider modules to operate according to the selected one of the plurality of operating modes.

Other features and advantages of the present invention should be apparent from the following description which illustrates, by way of example, aspects of the invention.

BRIEF DESCRIPTION OF THE DRAWINGS

The details of the present invention, both as to its structure and operation, may be gleaned in part by study of the accompanying drawings, in which like reference numerals refer to like parts, and in which.

DETAILED DESCRIPTION

The detailed description set forth below, in connection with the accompanying drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in simplified form in order to avoid obscuring such concepts.

Figure 1:
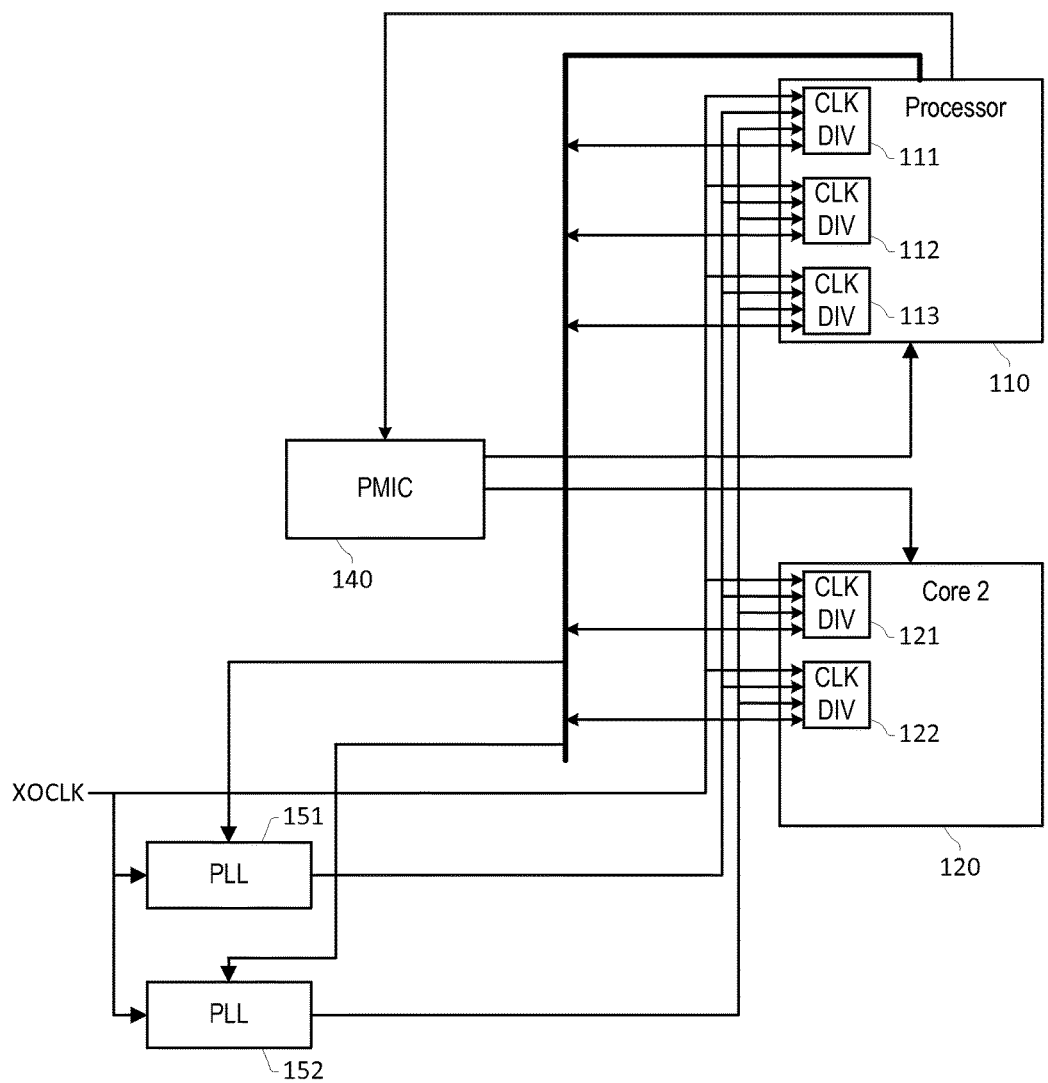
FIG. 1 is a functional block diagram illustrating aspects of clock and voltage scaling for an integrated circuit.

An example integrated circuit is illustrated in the functional block diagram of FIG. 1. The integrated circuit includes a processor module 110 and a core module 120. The processor module 110 and the core module 120 operate at independent supply voltages supplied by a power management IC (PMIC) 140. The PMIC may be a separate integrated circuit.

The integrated circuit also includes a first PLL 151 and a second PLL 152 that receive a clock signal (XOCLK, e.g., from a crystal oscillator) and produce clock signals for use by the processor module 110 and the core module 120. Operation of the PLLs, including the frequencies of the clock signals produced, is controlled by the processor module 110.

The processor module 110 includes a first clock divider module 111, a second clock divider module 112, and a third clock divider module 113. The clock divider nodules produce clocks for use by submodules of the processor module 110. Each clock divider module produces an output clock based on clock module controls. Each clock divider module can produce its output clock by selecting an input clock signal from among the XOCLK and the outputs of the PLLs and dividing the selected input clock signal by a divide value. Accordingly, the clock module controls can include signals that indicate the selection of the input clock signal and that indicate the divide value. The divide value indicates the ratio between the frequency of the output clock signal and the frequency of the selected input clock signal. Selection of the input clock signal and of the divide value is controlled by the processor module 110. The processor module 110, in an implementation, may have more than three clock divider modules, for example, an integrated circuit may have hundreds of clock divider modules. The processor module 110 may also include memory that stores software instructions for execution by a programmable processor.

The core module 120 can include other functions of the integrated circuit, for example, a graphics processor or a communications modem. The core module 120 includes a first clock divider module 121 and a second clock divider module 122. The clock divider modules are similar to the clock divider modules of the processor module 110, but the clock divider modules in the core module 120 produce clocks for use by submodules of the core module 120. Operation of the divider modules of the core module 120 are also controlled by the processor module 110. The core module 120, in an implementation, may have many more than two clock divider modules. Additionally, an integrated circuit may include many other modules like the processor module 110 or the core module 120.

The processor module 110 also controls operation of the PMIC 140. For example, the processor module can control output voltages of the PMIC, including the supply voltage used by the processor module 110.

The processor module 110 may control changing between frequency-voltage modes by writing to control registers (e.g., located in a clock divider module) associated with the various functions to be changed. Software control by the processor module 110 of the frequency-voltage modes can cause changes between modes to be slow. For example, a mode change may cause the processor to write to hundreds of control registers and take hundreds of microseconds.

Slow changes (latency) between modes can impair performance of the integrated circuit. For example, a slow change from a high-power mode to a low-power mode can cause the integrated circuit to consume additional energy during the transition. Since entry of the low-power mode by the integrated circuit is delayed, the integrated circuit spends less time in the low-power mode. For another example, a slow change from a low-performance mode to a high-performance mode can cause the integrated circuit to be delayed in performing its functions. Since entry of the high-performance mode by the integrated circuit is delayed, the integrated circuit is performing slower during the transition. Additionally, cycles of the processor used to perform the frequency-voltage mode change cannot be used to perform other functions.

Providing a low-latency frequency-voltage mode change can improve performance of the integrated circuit. Low-latency frequency-voltage mode changes can reduce power consumption by increasing the amount of time that the integrated circuit is in a low-power mode. Low-latency frequency-voltage mode changes can also increase performance by allowing a high-performance mode to begin sooner.

Additionally, a mode change performed by the processor module may be interrupted while the integrated circuit is in an intermediate state. The intermediate state may, for example, have some of the clock dividers set to the new mode and other clock dividers set in the prior mode. It may be complex to restore the original mode or to proceed to the new mode. Accordingly, providing a frequency-voltage mode change that is an atomic operation can resolve this complexity.

Figure 2:
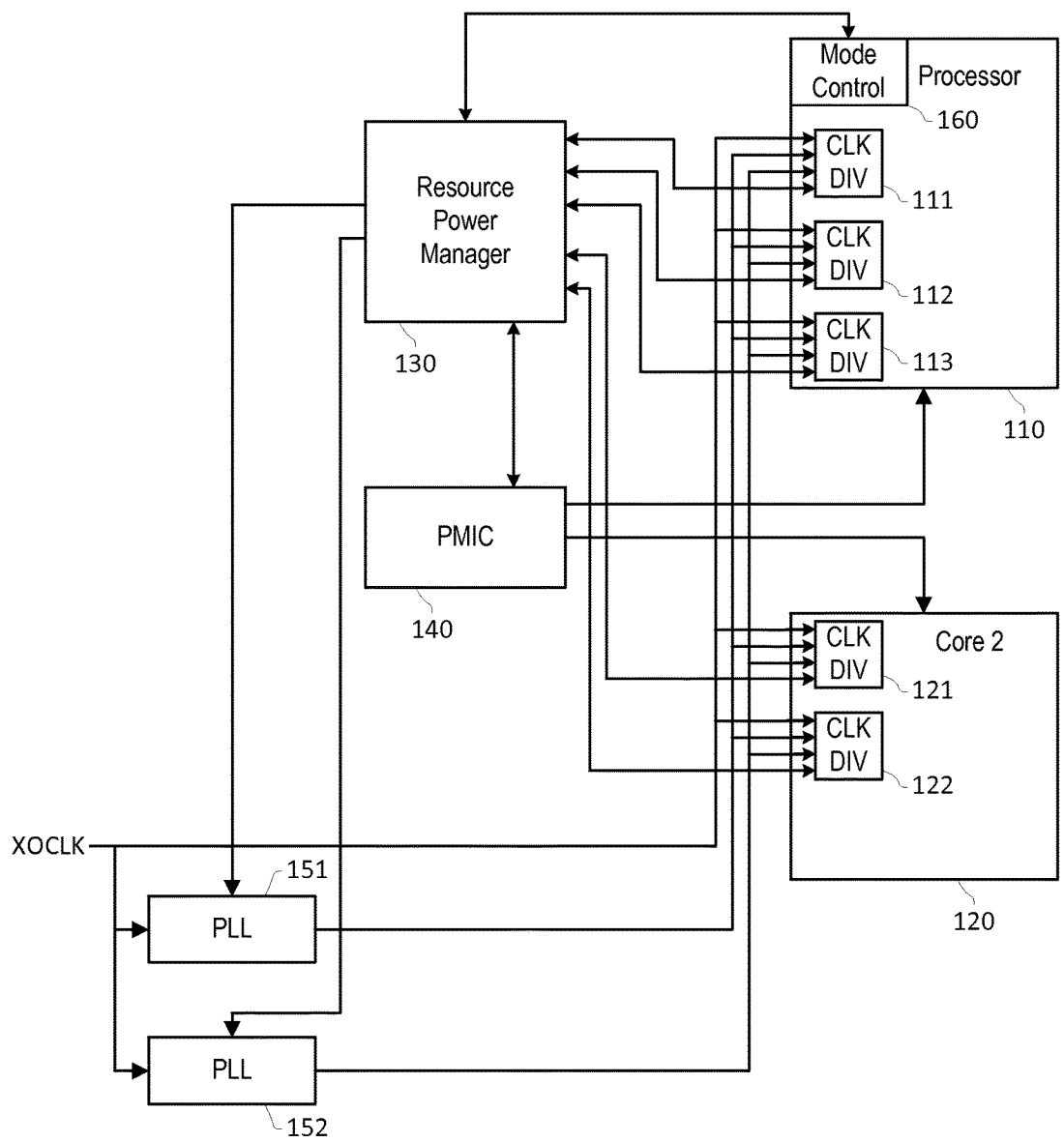
FIG. 2 is a functional block diagram illustrating aspects of clock and voltage scaling for a system-on-a-chip integrated circuit according to a presently disclosed embodiment.

FIG. 2 is a functional block diagram showing aspects of clock and voltage scaling for a system-on-a-chip (SoC) integrated circuit (IC). The integrated circuit of HG. 2 is similar to the integrated circuit of FIG. 1 with like named modules operating in like fashion except for described differences. The integrated circuit may be, for example, a mobile system modem that may be used in a mobile phone. The integrated circuit may be, for example, fabricated using a CMOS process.

The integrated circuit of FIG. 2 includes a resource power manager module 130. The resource power manager module 130 controls operation of the PLLs 151, 152, the PMIC 140, and the clock divider modules 111-113, 121-122. The resource power manager module 130 is connected to the processor module 110 and can receive a command to switch to a new frequency-voltage mode from a mode control module 160 of the processor module 110. The resource power manager module 130 may, for example, receive a mode selection from the mode control module 160. The mode selection may indicate that values from a selected one of a set of mode registers are to be used.

The mode control module 160 may be, for example, a software module with the processor module 110 executing instructions from memory to perform the functions of the mode control module 160. The mode control module 160 may alternatively be a module separate from the processor module 110.

The mode control module 160 may trigger a switch to a new mode, for example, by a single register write from the processor module 110 to the resource power manager module 130. The resource power manager module 130 can then perform the change in frequency-voltage mode without further interaction with the processor module 110. The resource power manager module 130 can perform multiple parts of the mode change, for example, changing divide values in the clock divider modules, concurrently. This can allow the mode change to be performed more quickly than when performed by a processor serially. Additionally, the processor module 110 can then perform other tasks while the resource power manager module 130 performs the mode change. Furthermore, the mode change operation can be an atomic operation that is not subject to a processor interrupt. When the mode change operation is an atomic operation, the mode change will be completed once it is started. Accordingly, the integrated circuit does not need to be able to operate under a partially the completed mode change and also does not need logic to handle recovery from a partially completed mode change.

Figure 3:
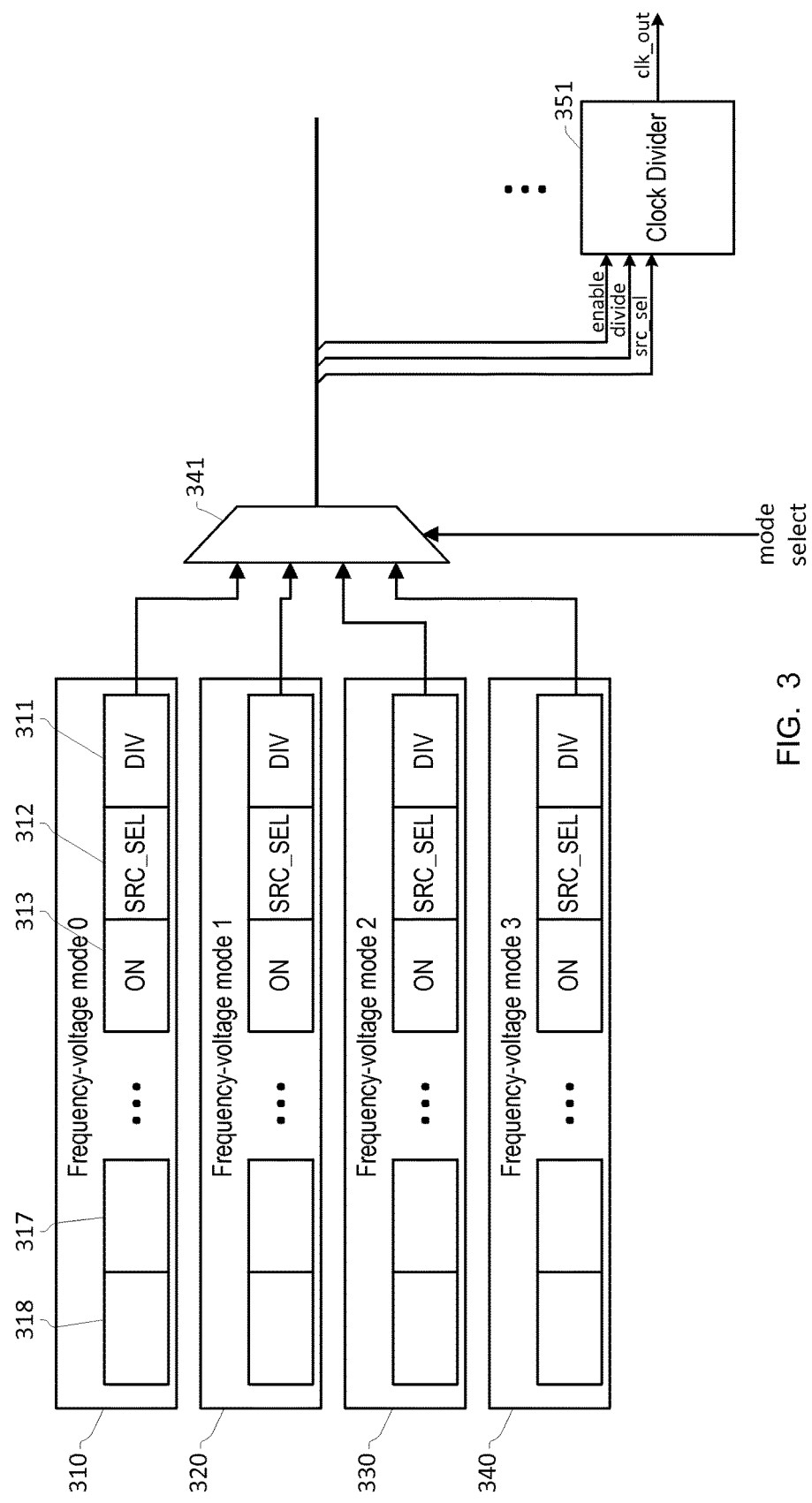
FIG. 3 is a functional block diagram illustrating aspects of operation of a resource power manager module according to a presently disclosed embodiment.

FIG. 3 is a functional block diagram illustrating aspects of operation of the resource power manager module 130 of the integrated circuit of FIG. 2. The resource power manager module 130 uses a set of mode registers, for example, four mode registers as shown in FIG. 3 (a first mode register 310, a second mode register 320, a third mode register 330, and a fourth mode register 340). Each of the mode registers is for one of the frequency-voltage modes. For example, the first mode register 310 may be for a high-frequency, high-voltage mode, and the fourth mode register 340 may be for a low frequency, low voltage mode. Each of the mode registers contains control bits that set the operating conditions for that mode. For an integrated circuit with more or less than four frequency-voltage modes, the resource power manager module will have a corresponding number of mode registers.

The first mode register 310, for example, includes a first clock divider value 311, a first clock source selection value 312, and a first clock output enable value 313. The first clock divider value 311, the first clock source selection value 312, and the first clock output enable value 313 are used to control a first one of the clock divider modules in the integrated circuit. The first clock output enable value 313 is used to control whether the output clock of the first clock module is enabled. The first clock source selection value 312 is used to control which of the source clocks (e.g., PLL output clocks or XOCLK) is used by the first clock divider module (e.g., clock divider module 111). The first clock divider value 311 is used to control the divide value of the first clock divider module (e.g., clock divider module 111). The clock divider value, the clock source selection value, and the clock output enable value may be termed clock module controls.

The first mode register 310 also includes clock divider values, clock source selection values, and clock output enable values for each of the other clock divider modules in the integrated circuit. For a given mode register, different ones of the clock divider modules may be controlled for various combinations of frequencies. The first mode register 310 also includes PMIC control values 317 (e.g., setting voltages) for controlling operation of the PMIC and PLL control values 318 for controlling operation (e.g., setting frequency) of the PLLs. The PMIC control values may also be termed PMIC controls and the PLL control values may also be termed phase-locked loop controls. The other mode registers contain corresponding control values for the other modes.

The values in the mode registers may be set to certain values by a hardware reset. These values may also be initialized by an initialization process (e.g., from a PROM). The values in the mode registers may also, in an embodiment, be set by the processor module. The processor module may, for example, redefine one of the modes by writing new values to the associated mode register. In an embodiment, only a subset of the mode registers are writable by the processor module.

The number of frequency-voltage modes included in an integrated circuit can be a design trade-off. A larger number of modes may allow the modes to be closely tailored to various operating conditions of the integrated circuit. A large number of modes also increases circuit complexity. When a block of the integrated circuit operates at a higher frequency it also needs to operate at a higher voltage. However, the block can operate at a lower frequency and the higher voltage. A change in voltage is generally slow compared to a change in frequency. The integrated circuit may include one or more sets of frequency-voltage modes that differ in clock frequencies but use the same voltages. The integrated circuit can very rapidly change between the modes in a set of modes that use the same voltages. This can provide improved power-performance trade-off's, for example, when the modes are used for a short time. Additionally, some register hardware may be shared between the modes.

When the frequency-voltage mode changes, a mode select signal controls a selector 341 to select values from the mode register corresponding to the selected mode. For example, the resource power manager module 130 may control the mode select signal. Alternatively, the mode control module 160 can supply the mode select signal. The selected values are supplied to the various modules controlled by the resource power manager module 130. For example, as illustrated in FIG. 3, the selected clock enable value, the selected clock divider value, and the selected clock source selection value are supplied to one of the clock divider modules 351 (e.g., clock divider module 111 or one of the other clock divider modules 112, 113, 121, 122). The values may, for example, be supplied to registers in the clock divider module 351. The clock divider module 351 uses the supplied control signals to produce its output clock clk_out. Although not illustrated in FIG. 3, an integrated circuit will have many additional clock divider modules that have control signals supplied by the selector 341. Control signals from the selector 341 are also supplied to the PMIC and the PLLs.

The resource power manager module may supply its control signals to the modules controlled by the resource power manager module such as clock divider modules 111-113, 121-122, the PLLs 151, 152, and the PMIC 140), in various ways. For example, the control signals may be supplied to all the modules controlled by the resource power manager module in parallel. Alternatively, the resource power manager module may provide some of the control signals serially. Clock signals used to interface between the resource power manager module and the modules controlled by the resource power manager module may be gated off between mode changes.

The resource power manager module 130 controls when new control signals are supplied to the various modules. In particular, the resource power manager module 130 can control the timing of controlling the PMIC relative to the timing of controlling the clock divider modules. For example, when both frequency (e.g., clock divider value) and supply voltage are to be increased, the supply voltage will generally be increased first, followed by changing the frequency. Similarly, when both frequency and supply voltage are to be decreased, the clock divider values will generally be decreased first, followed by changing the supply voltage. Additionally, to avoid glitches or undesired timing on the clock output, the resource power manager module may disable the output of a clock divider module before changing the clock source selection and reenable the output of the clock divider module after setting the new source selection. The resource power manager module may use a finite state machine to control timing of mode changes.

Figure 4:
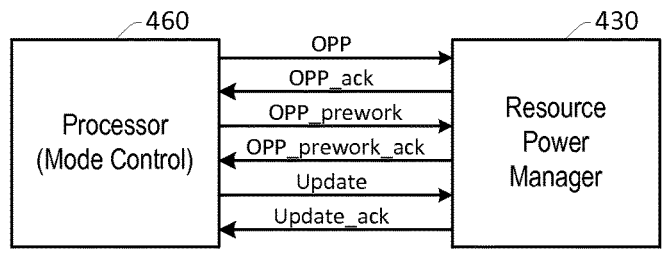
FIG. 4 is a functional block diagram illustrating an interface between a resource power manager module and a processor according to a presently disclosed embodiment.

FIG. 4 is a functional block diagram illustrating an interface between resource power manager module 430 and a processor 460 according to a presently disclosed embodiment. The interface may be used in the integrated circuit of FIG. 2 with the resource power manager module 430 and the processor mode control module 460 being, for example, the resource power manager module 130 and the processor module 110 (using the mode control module 160), respectively. The interface illustrated in FIG. 4 is exemplary and other interfaces may also be used.

The interface includes an OPP signal from the processor 460 to the resource power manager module 430 that signals the frequency-voltage mode. The OPP signal may, for example, indicate one of the mode registers 310, 320, 330, 340 illustrated in FIG. 3. When the OPP signal changes, the resource power manager module 430 acknowledges the change with an OPP_ack signal to the processor 460.

The interface also includes an OPP_prework signal from the processor 460 that can trigger the resource power manager module 430 to prepare for changing frequency-voltage mode. The resource power manager module 430 acknowledges the OPP_prework signal with an OPP_prework_ack signal to the processor 460. The prework is preparation for the mode change.

The interface includes an update signal that the processor 460 sends to the resource power manager module 430 to trigger the actual mode change. When the change, is completed, the update is acknowledged with an Update_ack signal sent from the resource power manager module 430 to the processor 460.

Figure 5:
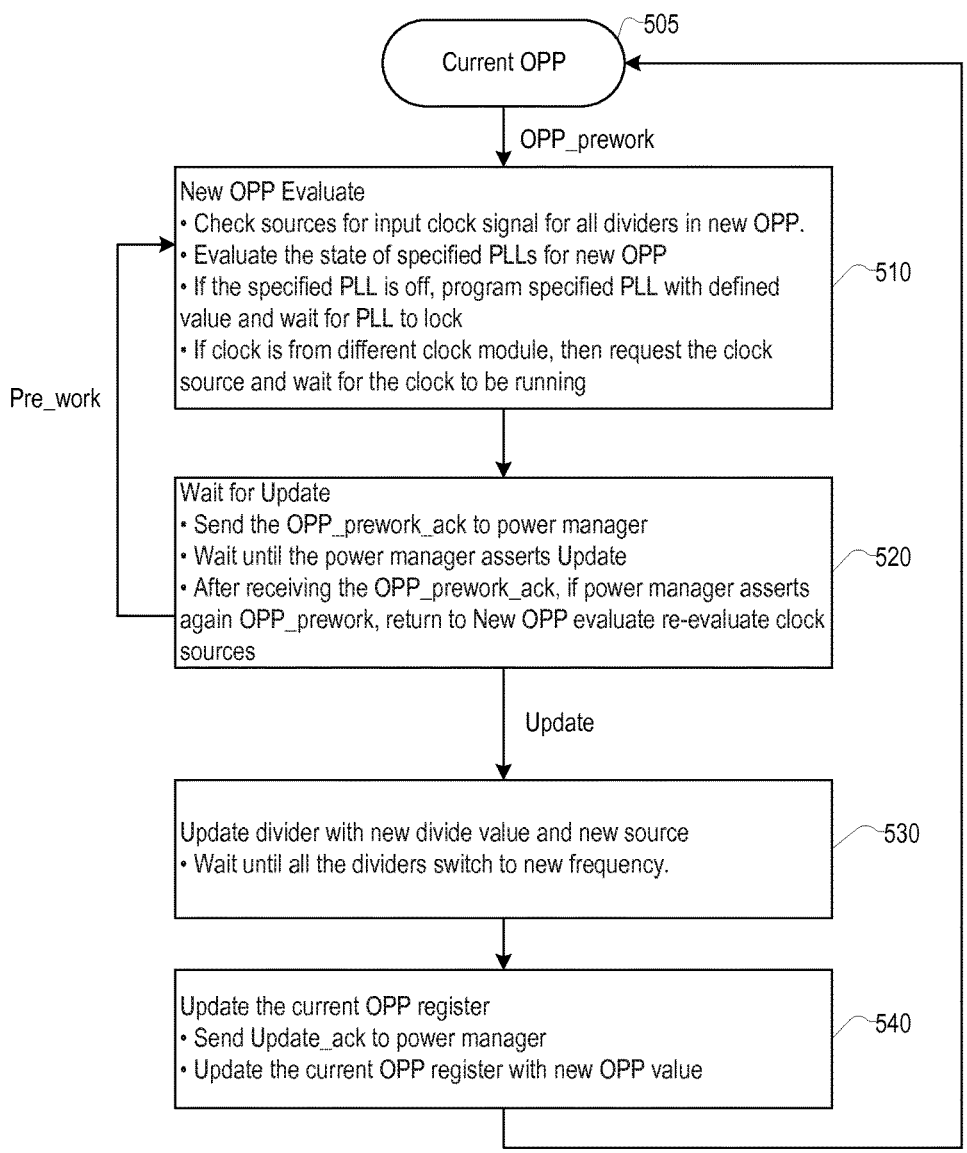
FIG. 5 is a flowchart illustrating a method for controlling clock and voltage scaling according to a presently disclosed embodiment.

FIG. 5 is a flowchart illustrating a process for controlling clock and voltage scaling according to a presently disclosed embodiment. The process may be performed with the integrated circuit of FIG. 2 and using the interface of FIG. 4. For example, the resource power manager module 130 may perform the process using signals received from the mode control module 160. A similar processes may be performed with other integrated circuits and using other interfaces. The illustrated process can be used to change the integrated circuit from a current frequency-voltage mode to a new frequency-voltage mode.

The illustrated process begins in a current OPP 505 that specifies the current frequency-voltage mode. When the resource power manager module 130 receives the OPP_prework signal from the mode control module 160, the resource power manager module 130 enters the new OPP evaluate step 510. This signals that the integrated circuit will change from the current OPP to a new OPP. In step 510, the process checks what the sources are for the input clock signals for the clock dividers specified by the new OPP. For each PLL that is specified to supply one of the input clock signals in the new OPP, the process evaluates the state of the specified PLL. If the specified PLL is off, the specified PLL is programmed according to the specified values for the new OPP. The resource power manager module 130 may, for example, program the specified PLL by writing to control registers associated with that PLL. The process then waits for the PLL to lock in its new state.

Additionally, a clock source (to a clock divider module or to a PLL supplying an input clock signal to a clock divider module) specified in the new OPP may be from a clock module (e.g., a crystal oscillator) that is not running in the current OPP. If a clock source is from a clock module that is not currently running, the process requests the clock source from that clock module and waits for the clock source to be running. The resource power manager module 130 may, for example, write to control registers associated with the clock module to enable it.

The process then enters a wait for Update step 520. The resource power manager module 130 sends the OPP_prework_ack to the mode control module 160 to signal completion of the prework. The resource power manager module 130 then waits for the Update to signal it to continue with the OPP mode change. If the resource power manager module 130 receives an additional OPP_prework while waiting for the Update signal, the process returns to the new OPP evaluate step 510 to re-evaluate a new OPP.

When the resource power manager module 130 receives the Update signal, the process continues to step 530. In step 530, the resource power manager module 130 supplies new clock module controls (e.g., divide values and input clock signal selections) to the clock divider modules. The resource power manager module 130 then waits for the clock divider modules to switch to their new states. The process may wait, for example, for a certain number of clock cycles.

The process then continues to step 540. In step 540, the resource power manager module 130 signals the Update_ack to the mode control manager 160. This indicates the new OPP is in effect. The process may also update the OPP register to reflect the values of the new OPP.

The resource power manager module 130 may, for example, use a finite state machine or a programmable processor to perform the process of FIG. 5. In an embodiment, the processor module 110 may be able to override steps performed by the resource power manager 130. For example, the resource power manager module 130 may interrupt the processor at various points in the process to allow the processor module 110 to intervene.

Figure 6:
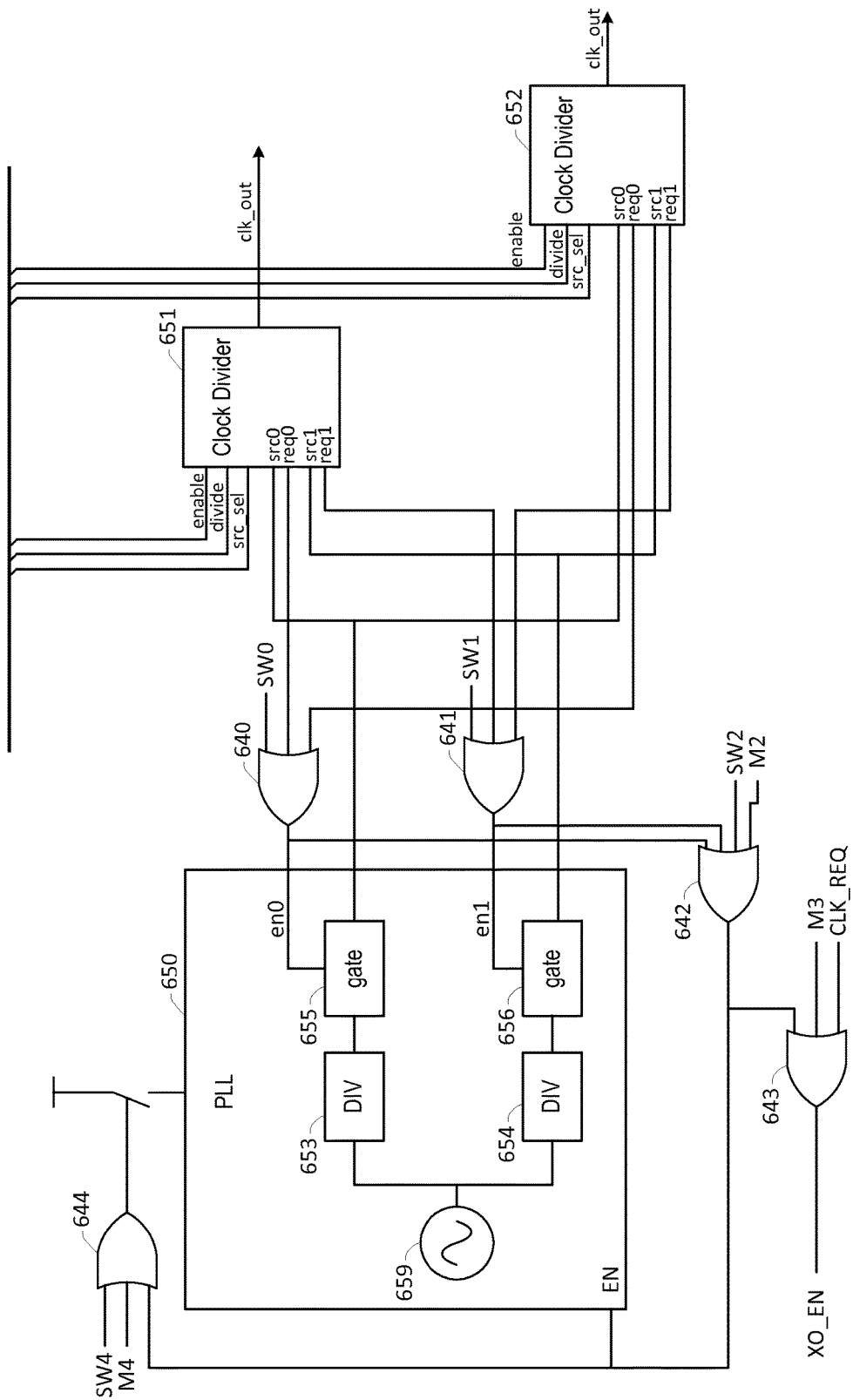
FIG. 6 is a functional block diagram illustrating aspects of phase-locked loop control according to a presently disclosed embodiment.

FIG. 6 is a functional block diagram illustrating aspects of PLL control according to a presently disclosed embodiment. The PLL control may be used in the integrated circuit of FIG. 2. The PLL is controlled by various signals related to a selected frequency-voltage mode. The control signals can include a PLL mode (e.g., including an on mode, an off mode, and one or more standby modes), frequency selection (e.g., signaled by M and N divider values), an input clock selection, and output clock enables.

In addition to the divider values used to synthesize a PLL frequency, the PLL may include dividers 653, 654 on the output clocks. Using a divider on the PLL output clock to lower its frequency can simplify design of the clock divider modules receiving the PLL output clock. For example, the clock divider modules do not need to operate at the maximum frequency when at a low voltage. Power consumption can also be reduced. For example, in a frequency-voltage mode with a low frequency and low voltage, including the PLL output clock divider can lower the maximum frequency that the clock divider module is designed to operate at when its supply is at the low voltage. Similarly, performance requirements of clock buffering circuits can also be reduced.

FIG. 6 illustrates a PLL 650, a first clock divider module 651, and a second clock divider module 652. When the PLL control of FIG. 6 is used in the integrated circuit of FIG. 2, the PlLL 650, the first clock divider module 651, and the second clock divider module 652 may be, for example, the PLL 151, the clock divider module 111, and the clock divider module 121, respectively. The clock divider modules receive control signals from a resource power manager module to control their divide value, their source selection, and whether their clock outputs are enabled. Possible sources for the clock source selection include two outputs of the PLL 650.

The PLL 650, as illustrated in FIG. 6, produces two output clocks that are enabled or disabled by gates 655, 656. The first output from gate 655 is enabled by a signal from OR gate 640. The second output from gate 656 is enabled by a signal from OR gate 641. The OR gates generally enable the respective outputs when the associated clock signal will be used by one of the clock dividers. Enabling the output clock signal from the PEE only when the clock signal is used can reduce power consumption.

The OR gate 640 enables the gate 655 when any of the OR gate's input signals are active. The first clock divider module 651 supplies a request signal to OR gate 640 to signal when the PILL clock signal from gate 655 is selected by the first clock divider module 651. The second clock divider module 652 also supplies a request signal to OR gate 640 when the PLL clock signal from gate 655 is selected by the second clock divider module 652. The OR gate 640 also receives a control signal SW0. The control signal SW0 may be a software control register value, for example, to override the normal operation of disabling the PEI, output clock signal when it is not used by one of the clock divider modules. The second gate 656 functions in a similar manner to the first gate 655.

The enables of the PLL output clock signals are combined in OR gate 642 to enable the PLL. OR gate 642 may also receive two control signals SW2, M2 which may be supplied, for example, by the processor module and the resource power manager module. The enable for the PEE from OR gate 642 is also supplied to OR gate 644 to enable a voltage supply to the PLL 650. The voltage supply enable may also be controlled by control signals M4, SW4. The enable for the PLL from OR gate 642 is also supplied to OR gate 643 to generate an oscillator enable signal. The oscillator enable may also be controlled by control signals M3, CLL_REQ.

Figure 7:
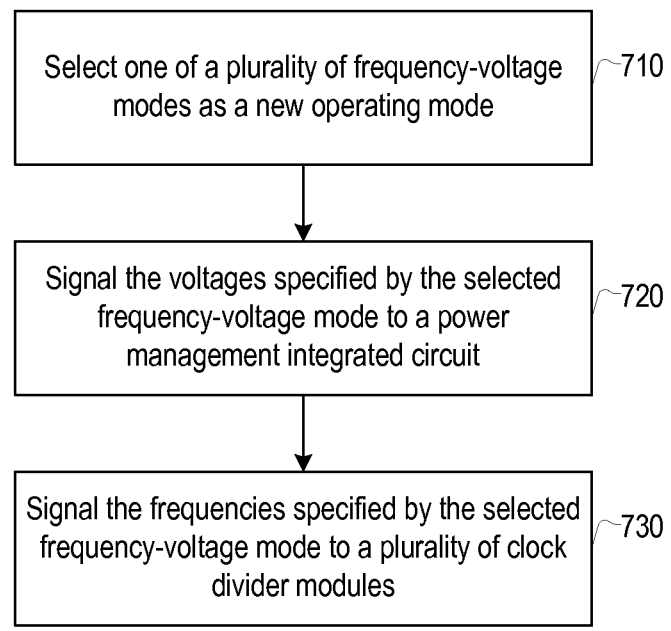
FIG. 7 is a flowchart of a process for switching operating modes in an integrated circuit according to a presently disclosed embodiment.

FIG. 7 is a flowchart of a process for switching operating modes in an integrated circuit according to a presently disclosed embodiment. The process may be performed, for example, using the integrated circuit of FIG. 2.

In step 710, a new operating mode is selected for the integrated circuit. The new operating mode may be selected, for example, by the mode control module 160. The new operating mode is selected from a plurality of frequency-voltage modes. Each of the frequency-voltage modes specifies operating clock frequencies and voltages for the integrated circuit.

In step 720, the voltages specified by the selected frequency-voltage mode are signaled to a power management integrated circuit. For example, the resource power manager module 130 may signal the PMIC, 140 to switch to a new voltage.

In step 730, the frequencies specified by the selected frequency-voltage mode are signaled to a plurality of clock divider modules. For example, the resource power manager module 130 may write to registers associated with the clock divider modules 111-113, 121-122 to signal the new output clock frequencies (e.g., using input clock signal selections and divide values) of the clock divider modules. The frequencies are provided to some or all of the clock divider modules concurrently.

The process for switching operating modes may be modified, for example, by adding, omitting, reordering, or altering steps. For example, step 730 may be performed before step 720 when the frequencies and voltages are decreasing. Additionally, steps may be performed concurrently.

Although embodiments of the invention are described above for particular embodiments, many variations of the invention are possible including those with different numbers of voltage supplies, different numbers of clock dividers, and different numbers of PLLs. Additionally, features of the various embodiments may be combined in combinations that differ from those described above.

Those of skill will appreciate that the various illustrative blocks and modules described in connection with the embodiments disclosed herein can be implemented in various forms. Some, blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the invention. In addition, the grouping of functions within a module, block, or step is for ease of description. Specific functions or steps can be moved from one module or block without departing from the invention.

The various illustrative logical blocks and modules described in connection with the embodiments disclosed herein can be implemented or performed with a general purpose processor, a digital signal processor (DSP), application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration.

The steps of a method or algorithm described in connection with the embodiments disclosed herein can be embodied directly in hardware, in a software module executed by a processor, or in a combination of the two. A software module can reside in RAM memory, flash memory, ROM memory, EPROM memory, EEPROM memory, registers, hard disk, a removable disk, a CD-ROM, or any other form of storage medium. An exemplary storage medium can be coupled to the processor such that the processor can read information from, and write information to, the storage medium. In the alternative, the storage medium can be integral to the processor. The processor and the storage medium can reside in an ASIC.

The above description of the disclosed embodiments is provided to enable any person skilled in the art to make or use the invention. Various modifications to these embodiments will be readily apparent to those skilled in the art, and the generic principles described herein can be applied to other embodiments without departing from the spirit or scope of the invention. Thus, it is to be understood that the description and drawings presented herein represent a presently preferred embodiment of the invention and are therefore representative of the subject matter which is broadly contemplated by the present invention. It is further understood that the scope of the present invention fully encompasses other embodiments that may become obvious to those skilled in the all and that the scope of the present invention is accordingly limited by nothing other than the appended claims.

What is claimed is:

1. An integrated circuit, comprising:
   a processor module configured to execute software instructions;
   a plurality of clock divider modules, each of the clock divider modules configured to produce an output clock signal based on control inputs; and
   a resource power manager module configured to receive a mode selection from the processor module, the mode selection indicating one of a plurality of operating modes comprising various frequency and voltage modes, the resource power manager module further configured to select one of a plurality of mode registers based on the mode selection, each one of the plurality of mode registers comprising both: (1) control inputs for operating the plurality of clock divider modules according to a respective one of the plurality of operating modes and to concurrently supply the control inputs from the selected one of the plurality of mode registers to control registers in at least two of the plurality of clock divider modules to operate according to the selected one of the plurality of operating modes; and (2) associated control inputs to signal a particular voltage level associated with the respective one of the plurality of operating modes, wherein each one of the plurality of mode registers comprises a clock divider value, a clock source selection value, and a clock output enable value, wherein the controller stabilizes the system clock and the silicon oscillator.

2. The integrated circuit of claim 1, wherein operations of the plurality of clock divider modules controlled by the resource power manager module include selection of one of a plurality of input clock signals for each of the clock divider modules, and a divide value for each of the clock divider modules indicating a ratio between a frequency of the respective output clock signal and a frequency of the respective selected input clock signal.

3. The integrated circuit of claim 2, wherein operations of the plurality of clock divider modules controlled by the resource power manager module further include selection of whether the output clock signal of each of the clock divider modules is enabled.

4. The integrated circuit of claim 2, further comprising one or more phase-locked loops (PLLs), each of the PLLs configured to produce one or more clock signals,
wherein the resource power manager module is further configured to control the PLLs to operate according to the selected one of the plurality of operating modes, and
wherein the plurality of input clock signals of the plurality of clock divider modules includes the clock signals produced by the PLLs.

5. The integrated circuit of claim 1, wherein controlling the plurality of clock divider modules to operate according to the selected one of the plurality of operating modes is an atomic operation.

6. The integrated circuit of claim 1, wherein the resource power manager module is further configured to control a power management integrated circuit (PMIC) to supply a voltage supply to the integrated circuit according to the selected one of the plurality of operating modes based on the associated control inputs.

7. The integrated circuit of claim 6, wherein the resource power manager module is further configured to control timing of controlling the PMIC relative to timing of controlling the plurality of clock divider modules.

8. The integrated circuit of claim 6, wherein the plurality of operating modes includes two operating modes causing the PMIC to supply the voltage supply at the same level, each of the two operating modes causing at least one of the plurality of clock divider modules to produce the respective output clock signal at different frequencies.

9. A method for switching operating modes in an integrated circuit, the method comprising:
selecting one of a plurality of frequency-voltage modes as a new operating mode for the integrated circuit, each of the frequency-voltage modes specifying clock module controls and voltages for the integrated circuit;
signaling the voltages specified by the selected frequency-voltage mode to a power management integrated circuit;
selecting one of a plurality of mode registers based on the selected frequency-voltage mode, each one of the plurality of mode registers comprising the clock mode module controls specified by a respective one of the plurality of frequency-voltage modes; and
supplying the clock module controls from the selected one of the mode registers to a plurality of clock divider modules, each of the clock divider modules configured to produce an output clock signal based on the clock module controls;
wherein the clock module controls from the selected one of the mode registers are supplied to control registers in at least two of the plurality of clock divider modules concurrently and wherein each one of the plurality of mode registers further comprises a clock divider value, a clock source selection value, and a clock output enable value.

10. The method of claim 9, wherein the clock module controls for each of the plurality of clock divider modules include a signal for selection of one of a plurality of input clock signals and a signal for a divide value indicating a ratio between a frequency of the respective output clock signal and a frequency of the respective selected input clock signal.

11. The method of claim 10, wherein the clock module controls for each of the clock divider modules further include a signal for controlling whether the respective output clock is enabled.

12. The method of claim 10, further comprising signaling phase-locked loop controls specified by the selected frequency-voltage mode to one or more phase-locked loops (PLLs), each of the PLLs configured to produce one or more clock signals based on the phase-locked loop controls, wherein the plurality of input clock signals of the plurality of clock divider modules includes the clock signals produced by the PLLs.

13. The method of claim 9, wherein selecting one of the plurality of frequency-voltage modes is performed by a processor.

14. The method of claim 10, wherein the plurality of frequency-voltage modes includes two frequency-voltage modes specifying a same voltage level, each of the two frequency-voltage modes specifying different clock module controls for at least one of the clock divider modules.

15. An integrated circuit, comprising:
a processor module configured to execute software instructions;
a plurality of clock divider modules, each of the clock divider modules configured to produce an output clock signal based on control inputs; and
a means for managing resource power configured to receive a mode selection from the processor module, the mode selection indicating one of a plurality of operating modes comprising various frequency and voltage modes, and configured to select one of a plurality of mode registers based on the mode selection, each one of the plurality of mode registers comprising both: (1) control inputs for operating the plurality of clock divider modules according to a respective one of the plurality of operating modes, and to concurrently supply the control inputs from the selected one of the mode registers to control registers in at least two of the plurality of clock divider modules to operate according to the selected one of the plurality of operating modes; and (2) associated control inputs to signal a particular voltage level associated with the respective one of the plurality of operating modes, wherein each one of the plurality of mode registers further comprises a clock divider value, a clock source selection value, and a clock output enable value.

16. The integrated circuit of claim 15, wherein operations of the plurality of clock divider modules controlled by the means for managing resource power include selection of one of a plurality of input clock signals for each of the clock divider modules, and a divide value for each of the clock divider modules indicating a ratio between a frequency of the respective output clock signal and a frequency of the respective selected input clock signal.

17. The integrated circuit of claim 16, wherein operations of the plurality of clock divider modules controlled by the means for managing resource power further include selection of whether the output clock signal of each of the clock divider modules is enabled.

18. The integrated circuit of claim 16, further comprising one or more phase-locked loops (PLLs), each of the PLLs configured to produce one or more clock signals,
wherein the means for managing resource power is further configured to control the PLLs to operate according to the selected one of the plurality of operating modes, and
wherein the plurality of input clock signals of the plurality of clock divider modules includes the clock signals produced by the PLLs.

19. The integrated circuit of claim 15, wherein controlling the plurality of clock divider modules to operate according to the selected one of the plurality of operating modes is an atomic operation.

20. The integrated circuit of claim 15, wherein the means for managing resource power is further configured to control a power management integrated circuit (PMIC) to supply a voltage supply to the integrated circuit according to the selected one of the plurality of operating modes based on the associated control inputs.

21. The integrated circuit of claim 20, wherein the means for managing resource power is further configured to control timing of controlling the PMIC relative to timing of controlling the plurality of clock divider modules.

22. The integrated circuit of claim 20, wherein the plurality of operating modes includes two operating modes causing the PMIC to supply the voltage supply at the same level, each of the two operating modes causing at least one of the plurality of clock divider modules to produce the respective output clock signal at different frequencies.

23. The integrated circuit of claim 1, wherein the control inputs from the selected one of the plurality of mode registers comprises a plurality of clock divider values, each of the clock divider values controls a divide value of a respective one of the clock divider modules, and the divide value of each of the clock divider modules is a ratio between a frequency of the respective output clock signal and a frequency of a respective input clock signal.

24. The integrated circuit of claim 1, wherein the control inputs from the selected one of the plurality of mode registers comprises a plurality of clock source selection values, and each of the clock source selection values controls selection of one of a plurality of input clock signals for a respective one of the clock divider modules.

* * * * *